United States Patent
Blatchford

(10) Patent No.: US 6,970,233 B2
(45) Date of Patent: Nov. 29, 2005

(54) SYSTEM AND METHOD FOR CUSTOM-POLARIZED PHOTOLITHOGRAPHY ILLUMINATION

(75) Inventor: James W. Blatchford, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 33 days.

(21) Appl. No.: 10/726,988

(22) Filed: Dec. 3, 2003

(65) Prior Publication Data
US 2005/0128458 A1 Jun. 16, 2005

(51) Int. Cl.[7] .......... G03O 27/72; G03O 27/54
(52) U.S. Cl. .......... 355/71; 355/67
(58) Field of Search .......... 355/52, 53, 55, 355/67–71; 359/484–487

(56) References Cited

U.S. PATENT DOCUMENTS

| | | | |
|---|---|---|---|
| 4,755,027 A * | 7/1988 | Schafer | 359/487 |
| 5,442,184 A * | 8/1995 | Palmer et al. | 250/492.2 |
| 6,392,800 B2 * | 5/2002 | Schuster | 359/485 |
| 6,522,392 B1 * | 2/2003 | Muller-Rissmann et al. | 355/67 |
| 6,809,794 B1 * | 10/2004 | Sewell | 355/30 |
| 2001/0019404 A1 * | 9/2001 | Schuster et al. | 355/67 |

OTHER PUBLICATIONS

B.W. Smith, J. Cashmore, "Challenges in high NA, polarization, and photoresists," Proceedings of SPIE vol. 4691, pp. 11-24.

T.A. Brunner, et al., "High NA lithographic imagery at Brewster's angle," Proceedings of SPIE vol. 4691, pp. 1-10.

* cited by examiner

Primary Examiner—Hung Henry V. Nguyen
(74) Attorney, Agent, or Firm—Peter K. McLarty; W. James Brady, III; Frederick J. Telecky, Jr.

(57) ABSTRACT

In one embodiment, a system for custom-polarized photolithography illumination includes an illuminator operable to generate an illumination pattern of light, a polarizer unit operable to variably polarize the light, and a mask pattern defining photolithographic pattern features in two dimensions. The mask pattern is associated with a mask capable of transmitting at least a portion of the variably polarized light through the mask pattern.

4 Claims, 3 Drawing Sheets

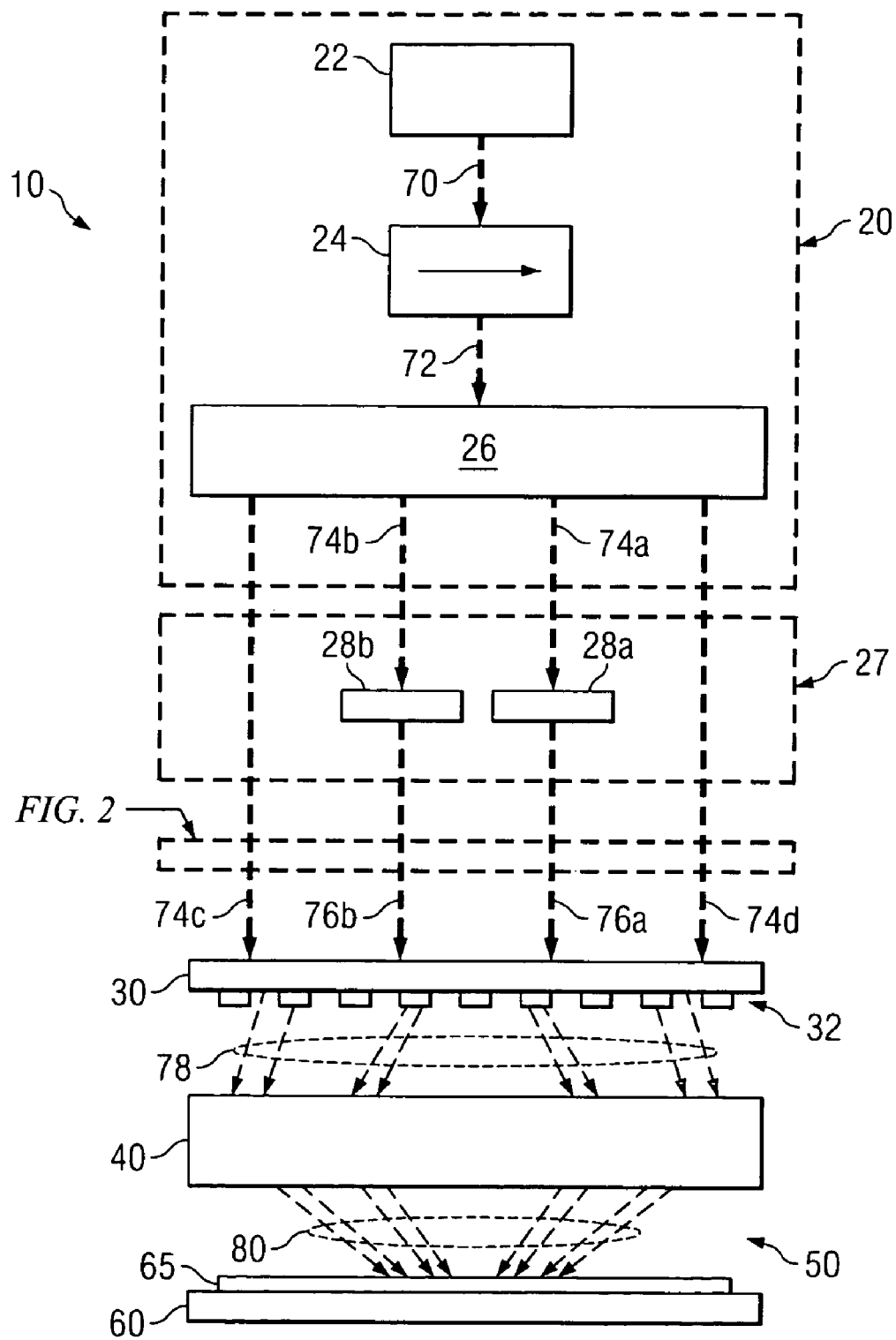

SYSTEM AND METHOD FOR CUSTOM-POLARIZED PHOTOLITHOGRAPHY ILLUMINATION

TECHNICAL FIELD OF THE INVENTION

This invention relates generally to photolithography systems and more particularly to a system and method for custom-polarized photolithography illumination.

BACKGROUND OF THE INVENTION

Achieving increasingly smaller line resolutions in semiconductor photolithography requires exposure tool systems with increasingly larger numerical apertures. As the numerical aperture increases, light transmitted through the lens illuminates the semiconductor wafer at Brewster's angle, which prevents light polarized parallel to the plane of incidence from coupling to the photoresistive material on the wafer. Conventional photolithography systems use unpolarized, circularly polarized, or linearly polarized illumination. In the case of unpolarized or circularly polarized illumination, interference of electrical fields exacerbated by Brewster angle effects can lead to a significant reduction in contrast for the resulting photolithographic image, decreasing the resolution of the system. In systems where light is linearly polarized, significant contrast loss may prevent geometry from being printable on the wafer.

SUMMARY OF THE INVENTION

In one embodiment, a system for custom-polarized photolithography illumination includes an illuminator operable to generate an illumination pattern of light, a polarizer unit operable to variably polarize the light, and a mask pattern defining photolithographic pattern features in two dimensions. The mask pattern is associated with a mask capable of transmitting at least a portion of the variably polarized light through the mask pattern.

In another embodiment, a method is provided for custom-polarized photolithography illumination. The method includes generating an illumination pattern, varying the polarization of the light in the illumination pattern, and transmitting the variably polarized light through a mask pattern associated with a mask and defining photolithographic pattern features in two dimensions.

In yet another embodiment, a system for custom-polarized photolithography illumination includes a means for generating an illumination pattern having linearly polarized light and a means for separating the illumination pattern into a plurality of light beams. The system also includes a means for varying the polarization of the light across the illumination pattern by rotating the polarization of at least a portion of the light to generate tangentially polarized light and a means for transmitting the variably polarized light through a mask pattern associated with a mask and defining photolithographic pattern features in two dimensions. The system further includes a means for directing the variably polarized light through a medium onto at least a portion of a photoresistive material disposed on a wafer and a means for exposing the photosensitive material to at least a portion of the variably polarized light to form a photolithographic pattern.

Technical advantages of one or more embodiments of the present invention may include the ability to vary the polarization of light specific to a desired illumination pattern to be projected onto the wafer. The polarization may be variable with respect to different light beams in the illumination pattern and/or different portions of a single light beam. Another technical advantage of one embodiment of the present invention is to provide for variable polarization of light to provide optimum line and space printing of a photolithographic image, thereby allowing for smaller images to be printed than are possible using conventional photolithography techniques. Still another technical advantage of the present invention is the ability to print photolithographic images in two directions using a single mask during a single exposure to the variably polarized light.

Certain embodiments may provide all, some, or none of these technical advantages. Certain embodiments may provide one or more other technical advantages, one or more of which may be readily apparent to those skilled in the art from the figures, description, and claims included herein.

BRIEF DESCRIPTION OF THE DRAWINGS

To provide a more complete understanding of the present invention and certain features and advantages thereof, reference is made to the following description taken in conjunction with the accompanying drawings, in which:

FIG. 1 illustrates an example system for generating a photolithographic image using variably polarized light;

DESCRIPTION OF EXAMPLE EMBODIMENTS

Figure 2A:
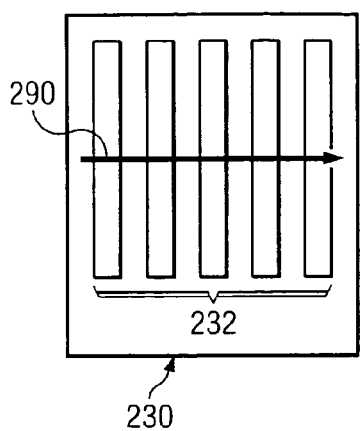
FIGS. 2A–2B illustrate light having incident polarization perpendicular to features of a mask pattern associated with a mask and the electrical fields associated with the incident light.

FIG. 1 illustrates an example system 10 for generating a photolithographic image using variably polarized light. System 10 may include an illuminator 20, a polarizer unit 27, a mask 30, a projection lens system 40, a medium 50, and a wafer 60. In certain embodiments, illuminator 20 may comprise a light source 22, a polarizer 24, and a prism system 26. Light source 22 may comprise any device or combination of devices capable of generating light used to create a photolithographic image. As used throughout this disclosure and the following claims, the term "light" refers to electromagnetic waves in both the visible light spectrum and invisible spectrum, including, but not limited to, visible light, ultraviolet light, and x-rays. For example, light source 22 may comprise a laser, such as an argon fluoride laser, a fluorine excimer laser, or a helium neon laser.

Illuminator 20 may also include polarizer 24. Polarizer 24 may include any device or combination of devices operable to pass light along a polarization axis associated with polarizer 24 or block light along a direction associated with polarizer 24. In the illustrated example, polarizer 24 is operable to receive light 70 from light source 22 and linearly polarize light 70 to generate linearly polarized light 72. Although polarizer 24 is illustrated as a distinct component from light source 22, in certain embodiments, polarizer 24 may be integral to light source 22, such that light source 22 generates linearly polarized light 72. Illuminator 20 also includes prism system 26. Prism system 26 may comprise any device or combination of devices operable to separate linearly polarized light 72 into one or more light beams 74. In the illustrated embodiment, prism system 26 is capable of separating linearly polarized light 72 into four light beams 74a–74d.

In certain embodiments, polarizer unit 27 may be contained within illuminator 20. In other embodiments, as illustrated in FIG. 1, polarizer unit 27 may be associated with, but not contained within, illuminator 20. Polarizer unit 27 may comprise one or more polarization rotators 28. Each polarization rotator 28 may comprise any device or combination of devices operable to alter the polarization of linearly polarized light beams 74, such as a half-wave plate. A linearly polarized light beam 74 incident upon polarization rotator 28 emerges from polarization rotator 28 as a rotated, linearly polarized light beam 76. In a particular example, where polarization rotator 28 comprises a half-wave plate, polarization rotator 28 rotates the polarization of light beam 76 such that its angle of polarization relative to the optical axis is approximately twice the angle of polarization of linearly polarized light beam 74 incident upon polarization rotator 28.

Figure 4A:
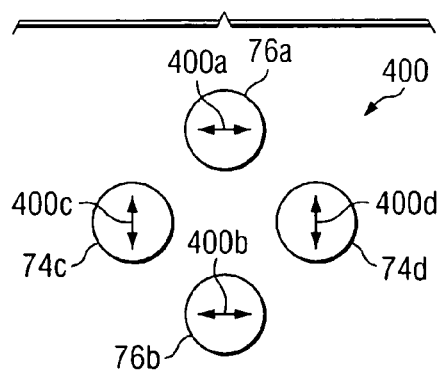
FIGS. 4A–4C illustrate example variably polarized illumination patterns formed using the system of FIG. 1.
Figure 4B:
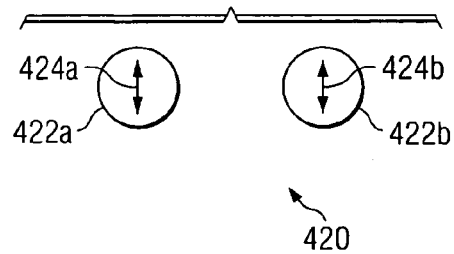
Figure 4C:
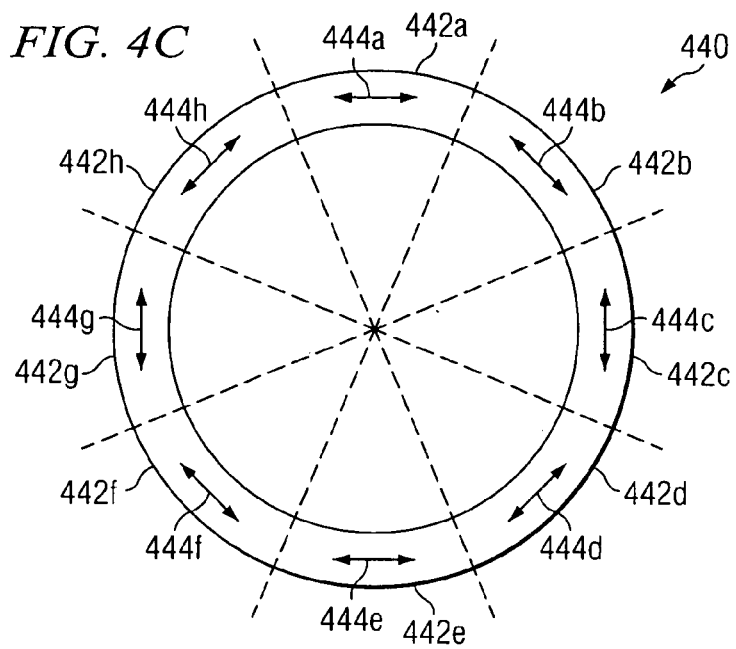

In certain embodiments, one or more polarization rotators 28 are capable of rotating the polarization at least a portion of linearly polarized light beams 74 to vary the polarization of light across illuminator 20 to create custom-polarized photolithography illumination. For example, in the illustrated embodiment, the polarizations of linearly polarized light beams 74a, 74b are rotated by polarization rotators 28a, 28b, respectively, while linearly polarized light beams 74c, 74d do not have their polarizations rotated. In this manner, the polarization of light 70 may be varied across illuminator 20 specific to the desired illumination pattern to be projected onto wafer 60. Example illumination patterns of variably polarized light are illustrated in FIGS. 4A–4C. Although specific examples of polarization rotators 28 are described above, any appropriate devices may be used to variably polarize different light beams or different portions of a single light beam of an illumination pattern to reduce or eliminate interference of the electrical fields of the light, as described below.

System 10 also includes a mask 30. Mask 30 may comprise any device or combination of devices operable to allow the transmission of at least a portion of linearly polarized light beams 74c, 74d and/or rotated, linearly polarized light beams 76a, 76b through a mask pattern 32 of mask 30. In certain embodiments, mask pattern 32 defines a photolithographic image with features in two dimensions that can be projected onto wafer 60. As an example only, mask pattern 32 may compromise a patterned emulsion of metal film. The light beams 74, 76 that are incident upon mask 30 and that are transmitted through mask pattern 32 are illustrated in FIG. 1 as light 78.

System 10 also includes a lens system 40. Lens system 40 may comprise any device or combination of devices operable to receive and focus light 78 and project the focused light 80 through medium 50 onto wafer 60. System 10 may also include a medium 50 disposed between lens system 40 and wafer 60. In certain embodiments, medium 50 may include air. In other embodiments, when implementing a technique known as immersion lithography, wafer 60 may be immersed in a liquid medium 50, such as water, having an index of refraction greater than one to improve photolithographic image resolution.

In certain embodiments, wafer 60 may comprise a semiconductor wafer. Wafer 60 comprises a thin layer of photoresistive material 65 disposed on a surface of wafer 60. In certain embodiments, photoresistive material 65 may comprise a photosensitive polymeric material disposed on at least a portion of a surface of wafer 60. Exposing photoresistive material 65 to light 80 enables the creation of the photolithographic image on wafer 60. For example, when light 80 is projected onto wafer 60, photoresistive material 65 may undergo wavelength-specific, radiation-sensitive chemical reactions which cause the portions of photoresistive material 65 exposed to light 80 to become either more or less acidic. If the portions of photosensitve material 65 exposed to light 80 become more acidic, photoresistive material 65 is referred to as a "positive photoresist," while if the portions of photoresistive material 65 becomes less acidic, photoresistive material 65 is referred to as a "negative photoresist." After exposure to light 80, photoresistive material 65 is exposed to a development solution, such as tetramethyl ammonium hydroxide, which removes either the exposed (positive photoresist) or the unexposed (negative photoresist) photoresistive material 65. For positive photoresist, the portions of photoresistive material 65 exposed to light 80 are washed away by the development solution, leaving a substantially exact copy of mask pattern 32 on the surface of wafer 60. If a negative photoresist is used, the portions of the negative photoresistive material exposed to light 80 remain on the surface of wafer 60 and the development solution removes only the portions of photoresistive material 65 that were unexposed to light 80.

By variably polarizing light 70 specific to the desired illumination pattern to be projected onto wafer 60, thereby creating custom-polarized photolithography illumination, a photolithographic image associated with mask pattern 32 can be projected onto the surface of wafer 60 using a single mask 30 during a single exposure of wafer 60 to light 80, advantageously eliminating the need for multiple masks 30 associated with a particular direction of photolithographic image features and multiple exposures of wafer 60 to light 80. Such custom polarization specific to the desired illumination pattern provides improved image and optimum line and space printing, thereby allowing for smaller images to be printed than are possible using conventional photolithography techniques. The properties of this custom polarization that provide these advantages are described below.

Figure 2B:
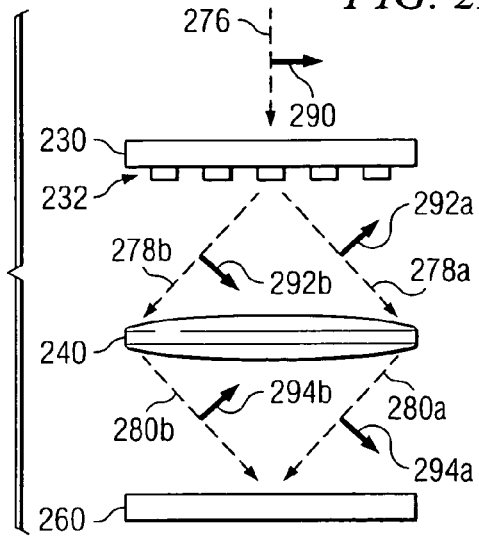

FIGS. 2A–2B illustrate light having incident polarization 290 perpendicular to features of mask pattern 232 associated with mask 230. The structure and function of mask 230 and mask pattern 232 can be substantially similar to the structure and function of mask 30 and mask pattern 32, respectively, of FIG. 1. FIG. 2B illustrates example electrical fields 290, 292, 294 associated with light 276 having incident polarization 200 perpendicular to the features of mask pattern 232. The structure and function of light 276 can be substantially similar to the structure and function of light 76 of FIG. 1. Light 276 comprises an associated electrical field 290 perpendicular to the features of mask pattern 232 of mask 230. As light 276 passes through mask pattern 232, it is defracted to create light 278a and 278b, which represent diffraction of light occurring in many directions (although only two directions are illustrated in FIG. 2B). Light 278a comprises an associated electrical field 292a perpendicular to the direction of propagation of light 278a, while light 278b comprises an associated electrical field 292b perpendicular to the direction of propagation light 278b.

As light 278 is transmitted through lens system 240, it is focused and redirected to emerge as light 280 projected onto wafer 260. The structure and function of lens system 240 and wafer 260 can be substantially similar to the structure and function of lens system 40 and wafer 60, respectively, of FIG. 1. Light 280a comprises an associated electrical field 294a perpendicular to the direction of propagation light 280a, while light 280b comprises an associated electrical field 294b perpendicular to the direction of propagation of light 280b. In the example illustrated in FIG. 2B, incident light polarization 200 perpendicular to the feature orientation of mask pattern 232 causes electrical fields 292a and 292b to interfere with each other and electrical fields 294a and 294b to interfere with each other, resulting in a loss of image contrast and, therefore, a loss of image quality projected onto the photoresistive material associated with wafer 260. By providing the ability to rotate the polarization of incident light using polarization rotators 28, the polarizations of the incident light can be varied to substantially reduce or eliminate electrical field interference, as illustrated in FIGS. 3A–3B.

Figure 3A:
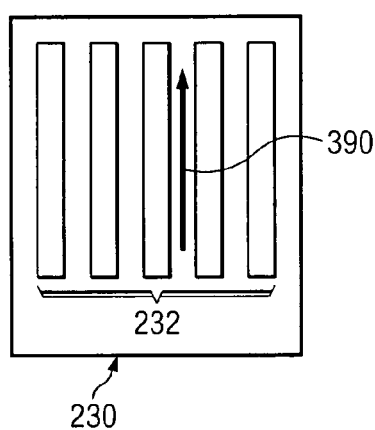
FIGS. 3A–3B illustrate light having incident polarization parallel to features of a mask pattern associated with a mask and the electrical fields associated with the incident light.
Figure 3B:
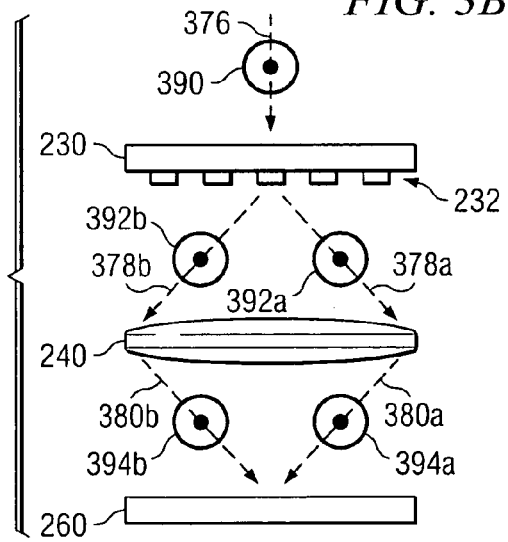

FIGS. 3A–3B illustrate light having incident polarization 390 parallel to the features of mask pattern 232 associated with mask 230. FIG. 3B illustrates example electrical fields 390, 392, 394 associated with light 376 having incident polarization 300 parallel to the features of mask pattern 232. The "bulls eye" symbols representing electrical fields 390, 392, 394 in FIG. 3B illustrate that the electrical fields associated with light 376, 378, 380 are coming out of the page towards the viewer. The structure and function of light 376 can be substantially similar to the structure and function of light 76 of FIG. 1. Light 376 comprises an associated electrical field 390 parallel to the features of mask pattern 232 associated with mask 230. As light 376 passes through mask pattern 232, it is defracted to create light 378a and 378b, which represent diffraction of light occurring in many directions (although only two directions are illustrated in FIG. 3B). Light 378a comprises an associated electrical field 392a parallel to the direction of propagation of light 378a, while light 378b comprises an associated electrical field 392b parallel to the direction of propagation light 378b.

As light 378 is transmitted through lens system 240, it is focused and redirected to emerge as light 380 projected onto wafer 260. Light 380a comprises an associated electrical field 394a parallel to the direction of propagation light 390a, while light 380b comprises an associated electrical field 394b parallel to the direction of propagation of light 380b. In the illustrated example, electrical fields 394a, 394b, associated with light 380a, 380b are parallel to each other. Because the electrical fields 394 are parallel to each other, they act cumulatively to increase the contrast of the photolithographic image projected onto wafer 260. Therefore, the image deterioration that occurs when the electrical fields at least partially cancel each other, as illustrated in FIG. 2B, is not present when the polarization of the light incident upon mask 230 is parallel to the features of mask pattern 232.

In certain embodiments, the ability to vary the polarization of the light incident upon the mask, such as mask 30, specific to the illumination pattern, enables photolithographic image features to be printed in two dimensions without a loss of contrast that usually occurs due to electrical field interference between different light beams.

FIGS. 4A–4C illustrate example variably polarized illumination patterns 400, 420, and 440 formed using illuminator 20. The examples of variable polarized illumination patterns illustrated in FIGS. 4A–4C may be referred to as "tangentially polarized" because symmetrically opposed light beams or light beam portions, such as opposing light beams 76a, 76b, opposing light beams 422a, 422b, and opposing light beam portions 442b, 442f, have polarizations in the same direction. Tangential polarization is desirable because it provides for opposing light beams or light beam portions to have parallel polarizations, thereby substantially reducing electrical field interference between opposing light beams or light beam portions due to diffraction caused by mask 30.

FIG. 4A illustrates an example rotated quadruple illumination pattern 400 formed using variably polarized light. In this example, prism system 26 separates linearly polarized light 72 into four linearly polarized light beams 74a–74d, as illustrated in FIG. 1. Linearly polarized light beams 74c and 74d have linear polarizations 400c, 400d which are oriented in the same direction. Linearly polarized light beams 74a and 74b are transmitted through polarization rotators 28a and 28b, respectively, creating rotated, linearly polarized light beams 76a, 76b. Rotated, linearly polarized light beams 76a, 76b have polarizations 400a, 400b, respectively, that are oriented in the same direction and that are perpendicular to the direction of the polarizations 400c, 400d of light beams 74c, 74d.

FIG. 4B illustrates an example dipole illumination pattern 420 formed across illuminator 20 using variably polarized light. In this example, prism system 26 separates linearly polarized light 72 into two light beams 422a, 422b. The structure and function of light beams 422 can be substantially similar to the structure and function of light beams 74 of FIG. 1. Light beams 422 are transmitted to mask 30 without passing through any polarization rotators 28, thereby retaining their linear polarizations 424a, 424b without any rotation. Linear polarizations 424a, 424b can be substantially similar to linear polarizations 74c, 74d of FIG. 2A.

FIG. 4C illustrates an example annular illumination pattern 440 formed across illuminator 20 using variably polarized light. In this example, illuminator 20 may comprise six polarization rotators 28 instead of the two polarization rotators 28a, 28b, illustrated in FIG. 1, to further customize the polarizations of the incident light. In this example, illuminator 440 may implement an appropriate device in combination with or in place of prism system 26 to form an annular light beam. Annular illumination pattern 440 may be "divided" into a plurality of portions. For example, but not by way of limitation, annular illumination pattern 440 may include eight light beam portions 442a–442h, as illustrated in FIG. 4C.

The polarizations of light beam portions 442a–442h may be rotated using appropriate polarization rotators 28 such that symmetrically opposed light beam portions have the same direction of polarization. For example, linearly polarized light beam portions 442c, 442g have linear polarizations 444c, 444g, which are orientated in the same direction. In the illustrated embodiment, light beam portions 442c, 442g are not transmitted through polarization rotators 28. Light beam portions 442a, 442e comprise rotated, linear polarizations 444a, 444e resulting from light beam portions 442a, 442e being transmitted through polarization rotators 28. Illumination pattern 440 also comprises light beam portions 442b, 442d, 442f, and 442h which have rotated, linear polarizations 444b, 444d, 444f, and 444h, respectively, resulting from light beam portions 442b, 442d, 442f, and 442h being transmitted through additional polarization rotators 28.

Although specific examples of custom polarizations are described above, any custom polarization of one or more light beams, or portions thereof, of an illumination pattern may be variably polarized (and not limited to tangential polarization) such that electrical field interference among corresponding light beams or light beam portions is substantially reduced, thereby improving the quality of the projected image.

Figure 5:
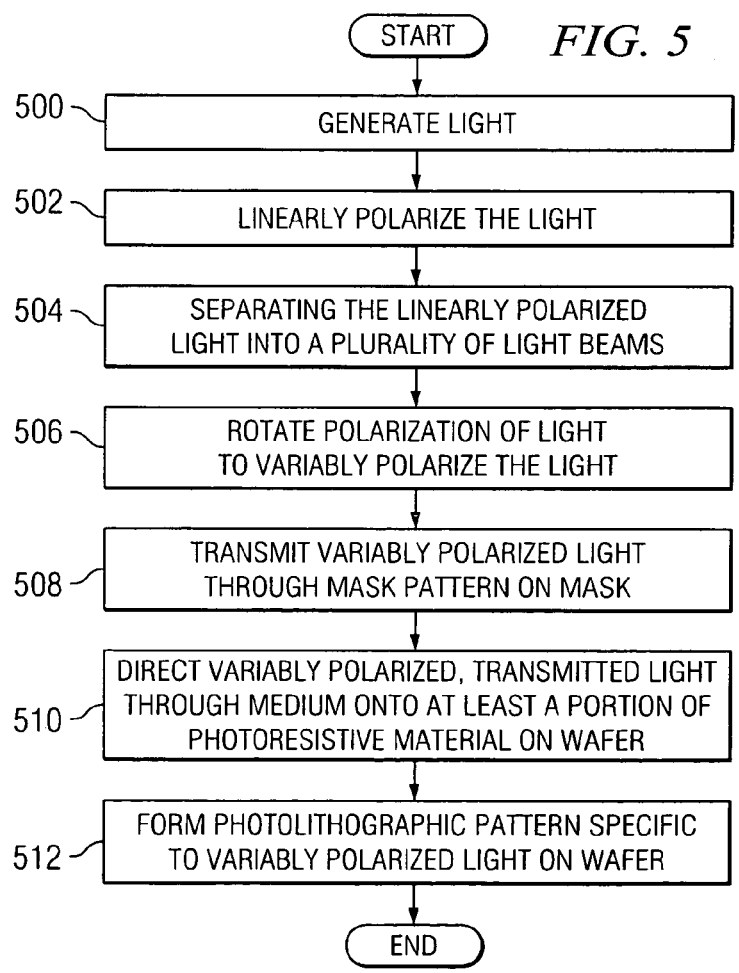
FIG. 5 illustrates an example method for generating a photolithographic image using variably polarized light.

FIG. 5 illustrates an example method for generating a photolithographic image using variably polarized light. The example method begins at step 500, where light is generated using a light source, such as light source 22 of FIG. 1. At step 502, light 70 generated by light source 22 is linearly polarized by a polarizer, such as polarizer 24 of FIG. 1. At step 504, linearly polarized light 72 may be separated into one or more light beams 74 by a prism system, such as prism system 26 of FIG. 1. At step 506, the polarization of one or more of the light beams 74 exiting prism system 26 is rotated using one or more polarization rotators, such as polarization rotators 28 of FIG. 1. In certain embodiments, one or more polarization rotators 28 are capable of rotating the polarization of one or more of the linearly polarized light beams 74 to vary the polarization of light across illuminator 20 to create tangential polarization. For example, the polarization may be varied as illustrated in FIGS. 4A–4C or in any other suitable manner. At step 508, variable polarized light 76 is transmitted through mask pattern 32 associated with mask 30. At step 510, the rotated, polarized light beams 78 are received by a lens system 40 and projected through medium 50 onto at least a portion of photoresistive material 65 associated with wafer 60 as light 80. At step 512, a photolithographic pattern is formed by light 80 on the photoresistive material 65 associated with wafer 60. After exposure to light 80, wafer 60 may be processed in a suitable manner.

Although an example method is illustrated, the present invention contemplates two or more steps taking place substantially simultaneously or in a different order. In addition, the present invention contemplates using methods with additional steps, fewer steps, or different steps, so long as the steps remain appropriate for custom-polarized photolithographic illumination.

Although the present invention has been described with several embodiments, a multitude of changes, substitutions, variations, alterations, and modifications may be suggested to one skilled in the art, as it is intended that the invention encompass all such changes, substitutions, variations, alterations, and modifications as fall within the spirit and scope of the appended claims.

What is claimed is:

1. A method for custom-polarized photolithography illumination, comprising:

generating an illumination pattern comprising a quadrupole illumination pattern having a first and second set of symmetrically opposed light beams, the method further comprising rotating the polarization of at least a portion of the illumination pattern such that the first set of symmetrically opposed light beams have polarizations in the same direction and the second set of symmetrically opposed light beams have polarizations in the same direction, wherein the polarization direction of the first set of light beams is perpendicular to the polarization direction of the second set of light beams; and transmitting the illumination through a mask pattern associated with a mask and defining photolithographic pattern features in two dimensions.

2. The method of claim 1, further comprising varying the polarization of a different portion of the light using a different polarization rotator.

3. The method of claim 1, wherein at least one polarization rotator comprises a half-wave plate.

4. The method of claim 1, wherein the illumination pattern comprises a dipole illumination pattern having two symmetrically opposed light beams, the method further comprising rotating the polarization of at least a portion of the illumination pattern such that the two symmetrically opposed light beams have polarizations in the same direction.

* * * * *